(12) United States Patent
Canaperi et al.

(10) Patent No.: US 10,937,892 B2
(45) Date of Patent: Mar. 2, 2021

(54) NANO MULTILAYER CARBON-RICH LOW-K SPACER

(71) Applicant: International Business Machines Corporation, Armonk, NY (US)

(72) Inventors: Donald Canaperi, Bridgewater, CT (US); Richard A. Conti, Altamont, NY (US); Thomas J. Haigh, Jr., Claverack, NY (US); Eric Miller, Watervliet, NY (US); Son Nguyen, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 16/127,720

(22) Filed: Sep. 11, 2018

(65) Prior Publication Data

US 2020/0083345 A1 Mar. 12, 2020

(51) Int. Cl.
*H01L 29/66* (2006.01)
*H01L 21/02* (2006.01)
*H01L 29/417* (2006.01)

(52) U.S. Cl.
CPC ...... *H01L 29/6656* (2013.01); *H01L 21/0234* (2013.01); *H01L 21/02167* (2013.01); *H01L 21/02203* (2013.01); *H01L 21/02274* (2013.01); *H01L 29/41775* (2013.01); *H01L 29/41791* (2013.01)

(58) Field of Classification Search
CPC ..... H01L 21/823864; H01L 21/823468; H01L 29/66689; H01L 29/66553; H01L 21/0234; H01L 21/02274; H01L 29/41791; H01L 29/66795; H01L 29/785; H01L 29/66568; H01L 21/02167
See application file for complete search history.

(56) References Cited

U.S. PATENT DOCUMENTS

| | | |
|---|---|---|
| 7,763,979 B2 | 7/2010 | Ohto et al. |
| 7,879,683 B2 | 2/2011 | Al-Bayati et al. |
| 8,357,608 B2 | 1/2013 | Gates et al. |
| 8,779,600 B2 | 7/2014 | Nguyen et al. |
| 9,123,727 B2 | 9/2015 | Fischer |

(Continued)

OTHER PUBLICATIONS

Alfred Grill et al., "Progress in the development and understanding of advanced low k and ultralow k dielectrics for very large-scale integrated interconnects—State of the art", Applied Physics Reviews 1, 011306 (2014); View online: http://dx.doi.org/10.1063/1.4861876; 18 pages.

(Continued)

*Primary Examiner* — Thanhha S Pham
(74) *Attorney, Agent, or Firm* — Cantor Colburn LLP; Douglas Pearson (57) ABSTRACT

A method of making a semiconductor device includes forming a gate stack on a substrate. The method further includes depositing a first spacer layer on a sidewall of the gate stack. The first spacer layer includes silicon and carbon. The method includes performing a first nitrogen plasma treatment process on the first spacer layer to increase a density of the first spacer layer. The method further includes depositing a second spacer layer on the first spacer layer. The second spacer layer includes silicon, carbon, and nitrogen.

15 Claims, 11 Drawing Sheets

(56) References Cited

U.S. PATENT DOCUMENTS

| | | | |
|---|---|---|---|
| 9,768,024 | B1 | 9/2017 | Tsai et al. |
| 9,882,022 | B2 | 1/2018 | Kuo et al. |
| 9,935,002 | B2 | 4/2018 | King et al. |
| 2009/0176367 | A1 | 7/2009 | Baks et al. |
| 2013/0330482 | A1 | 12/2013 | Leu et al. |
| 2016/0314965 | A1* | 10/2016 | Nguyen ............ H01L 21/76224 |
| 2020/0006151 | A1* | 1/2020 | Kao .................. H01L 29/66795 |

OTHER PUBLICATIONS

C. H. Ko et al., "A novel CVD-SiBCN (k=5.2) Low-K spacer technology for high-speed applications", VLSI Technology, 2008 Symposium Proceeding, Honolulu, Hawaii, USA, Jun. 17-19, 2008, pp. 108-109, ISBN:978-1-4244-1802-2. http://ieeexplore.ieee.org/document/4588581/.

D. Benoit et al., "Interest of SiCO Low k=4.5 Spacer Deposited at Low Temperature (400° C.) in the perspective of 3D VLSI Integration", IEDM 2015 Conference Proceeding, sec 8.6.2, pp. 201-204, Washington D.C.

Nguyen, S., et al., "Pinch-Off Plasma CVD Deposition Process and Material Technology for Nano-Device Air Gap/Spacer Formation", (2018) ECS Transactions, 85(6), pp. 25-39.

Priyadarshini, D. et al., "Ultrathin conformal multilayer SiNO dielectric cap for capacitance reduction in Cu/low k interconnects", Interconnect Technology Conference/Advanced Metallization Conference (IITC/AMC), 2016 IEEE International, pp. 92-94.

Son Van Nguyen et al., "Initial Transient Phenomena Impact on Plasma CVD of Ultrathin Silicon Nitride and Silicon Carbon Nitride Dielectrics for Nano Devices Cu-Low k Interconnects", Meeting Abstract MA2016-02 1500, 3 pgs.

Son Van Nguyen et al., ECS Fall 2009 Meeting Abstract 2159; "Plasma deposition and development of ultra low k bilayer SiCNx/SiCNy dielectric Cu cap for 32 nm CMOS devices", 2 pages.

* cited by examiner

NANO MULTILAYER CARBON-RICH LOW-K SPACER

BACKGROUND

The present invention generally relates to fabrication methods and resulting structures for semiconductor devices. More specifically, the present invention relates to nano-dimensioned multilayer carbon-rich low-k spacers.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer, and spacers are typically provided along sidewalls of the gate. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

SUMMARY

Embodiments of the present invention are directed to a method for fabricating a semiconductor device. A non-limiting example of the method includes forming a gate stack on a substrate. The method further includes depositing a first spacer layer on a sidewall of the gate stack. The first spacer layer includes silicon and carbon. The method includes performing a first nitrogen plasma treatment process on the first spacer layer to increase a density of the first spacer layer. The method further includes depositing a second spacer layer on the first spacer layer. The second spacer layer includes silicon, carbon, and nitrogen.

Another non-limiting example of the method includes forming a gate stack on a substrate. The method further includes depositing a first spacer layer on a sidewall of the gate stack. The first spacer layer includes silicon and carbon. The method includes depositing a second spacer layer on the first spacer layer. The second spacer layer includes silicon, carbon, and nitrogen. The method includes depositing a third spacer layer on the second spacer layer. The third spacer layer includes silicon, carbon, and nitrogen. A combination of the first spacer layer, the second spacer layer, and the third spacer layer has a dielectric constant (k value) of less than 4.0.

Another non-limiting example of the method includes forming a gate stack on a substrate. The method further includes depositing a first spacer layer on a sidewall of the gate stack by a first plasma enhanced chemical vapor deposition (PECVD) method. The first spacer layer includes silicon and carbon. The method includes performing a first nitrogen plasma treatment on the first spacer layer. The method further includes depositing a second spacer layer on the first spacer layer by a second PECVD method. The second spacer layer includes silicon, carbon, and nitrogen.

Embodiments of the present invention are directed to a semiconductor device. A non-limiting example of the semiconductor device includes a gate stack arranged on a substrate. The semiconductor device further includes a multilayer gate spacer arranged on a sidewall of the gate stack. The multilayer gate spacer has a k value of less than 4.0.

Another non-limiting example of the semiconductor device includes a gate stack arranged on a substrate. The semiconductor device further includes a multilayer gate spacer arranged on a sidewall of the gate stack. The multilayer gate spacer includes a first spacer layer and a second spacer layer. Each of the first spacer layer and the second spacer layer includes silicon and carbon and has a k value of less than 5.3.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as semiconductor devices shrink to smaller dimensions, parasitic capacitances through the gate sidewall spacer contributes more to the total device capacitance. However, using a low-k material, instead of silicon nitride for example with a relatively large dielectric constant (k~7.0), reduces capacitive coupling through the gate spacer.

Although some low-k spacer materials, such as boron doped films (e.g., SiBCN) and oxygen doped films (e.g., SiCO), can reduce capacitance, these materials can be sensitive to moisture, as well as oxidation and metal diffusion during some downstream processing steps. Modifications to the gate spacers due to these sensitivities can render them unstable and ineffective. Although materials of the type described above are conventionally labeled as "low-k," the k-value of spacers made from these materials are still relatively high, with k values of greater than 4.5, for example.

Turning now to an overview of the aspects of the invention, one or more embodiments of the invention address the above-described shortcomings of the prior art by providing a carbon rich gate spacer material with an ultra-low k value, for example, less than 4.0 according to some embodiments of the invention. The gate spacer material is deposited in a nano-layer process, as multiple thin layers, which provides improved conformal uniform coverage and etch selectivity. Using multiple thin layers also allows incorporation of more robust intermediate layers with a higher k value. Intermediate nitrogen plasma treatment processing is performed to enrich the layers with nitrogen, which increases the layer density, and thereby stability.

The above-described aspects of the invention address the shortcomings of the prior art by using multiple carbon enriched nano-layers, with intermediate nitrogen plasma treatment processing, to provide ultra-low k gate spacers that are stable, and not susceptible to modifications due to moisture, oxidants, or metal diffusion during downstream processing.

Turning now to a more detailed description of aspects of the present invention, FIGS. 1-11 show the results of respective processing steps that have been applied to a semiconductor device 100 in accordance with embodiments of the present invention. In still further implementations, the fabrication operations applied to the semiconductor device 100 in accordance with aspects of the present invention can be incorporated into the fabrication of a variety of transistor architectures, including, for example, planar technologies, FinFET technologies, vertical transport FET, or nanosheet FET technologies, with either a gate first or gate last implementation. The gate stacks 110 should be understood by those of ordinary skill as a dummy gate or an active gate.

Figure 1:
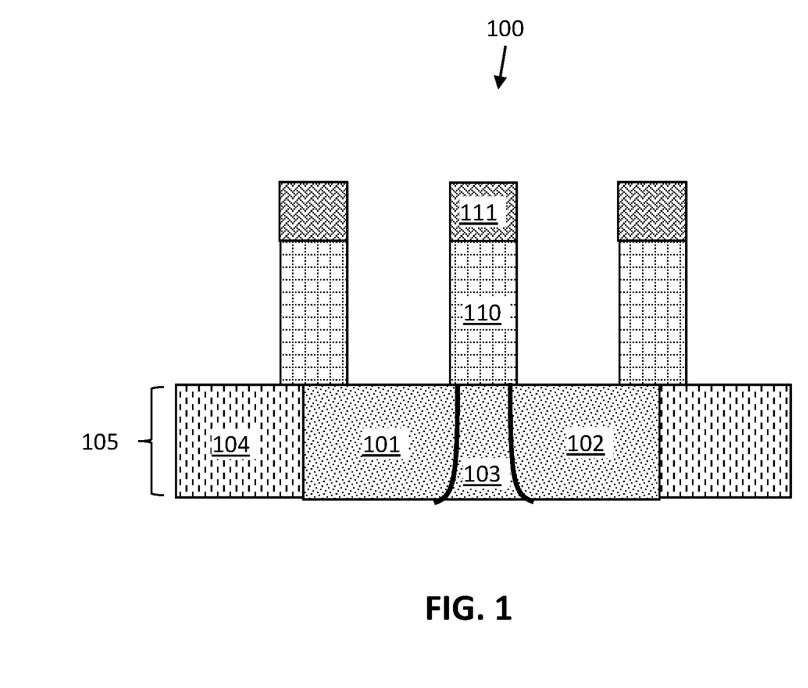
FIG. 1 depicts cross-sectional side view of gate stacks arranged on a substrate according to embodiments of the present invention.

In any scenario, the cross-sectional side view of the semiconductor device 100 shown in FIG. 1 includes gate stacks 110 arranged on a substrate 105 according to embodiments of the present invention. The substrate includes a fin 103 forming a channel region, which is formed in the substrate 105. A source 101 and a drain 102 are formed in the substrate 105 on opposing sides of the fin 103. Shallow trench isolation (STI) regions 104 are formed in the substrate 105 between fins 103. The gate stacks 110 are arranged on the substrate 105 in contact with the source 101 and drain 102. A gate cap 111 is positioned on a surface of each of the gate stacks 110.

The substrate 105 includes one or more semiconductor materials. Non-limiting examples of suitable substrate 105 materials include silicon (Si), germanium (Ge), silicon carbide (SiC), silicon germanium, (SiGe), silicon germanium carbide (SiGeC), Si alloys, Ge alloys, III-V materials (e.g., gallium arsenide (GaAs), indium arsenide (InAs), indium phosphide (InP), or aluminum arsenide (AlAs)), II-VI materials (e.g., cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), or any combination thereof. Other examples of suitable substrates include silicon-on-insulator (SOI) substrates with buried oxide (BOX) layers.

In a FinFET, fins 103 are patterned and formed in the substrate 105. The FinFET can include any number of fins 103 arranged in a fin array. The fins 103 can be patterned in the substrate 105 by, for example, sidewall imaging transfer. After patterning, the fins 103 are formed by etching the substrate 105.

A STI process is performed to form the STI regions 104 in the substrate 105. The STI regions 104 are isolation regions formed by etching trenches in the substrate 105 and then filling the trenches with at least one dielectric material, for example, silicon dioxide. Other non-limiting examples of suitable dielectric materials for the STI regions 104 include tetraethylorthosilicate (TEOS) oxide, high aspect ratio plasma (HARP) oxide, high temperature oxide (HTO), high density plasma (HDP) oxide, oxides formed by an atomic layer deposition (ALD) process, silicon nitride, silicon oxynitride, or any combination thereof. In some embodiments, the substrate 105 is a silicon-on-insulator (SOI) and the STI process can be omitted.

A source 101 and a drain 102 (active areas) are formed on the substrate 105. An epitaxial growth process can be performed to deposit epitaxial material onto the substrate 105 to form the source 101 and drain 102. Epitaxial growth can be formed using chemical vapor deposition (CVD), vapor-phase epitaxy (VPE), molecular-beam epitaxy (MBE), liquid-phase epitaxy (LPE), or other suitable process. The epitaxial growth can be doped during deposition. Alternatively, the source 101 and drain 102 can be formed by incorporating dopants into the substrate 105.

Gate stacks 110 are formed on the substrate 105. In some embodiments, a first gate, a second gate, and a third gate are formed on the substrate 101, as shown. The first gate stack 110 contacts the source 101, the second gate stack 110 contacts both the source 101 and the drain 102, and the third gate stack 110 contacts the drain 102. In some embodiments of the present invention, the gate stacks 110 each include a stack of one or more dielectric materials, one or more work function metals, and one or more metal gate conductor materials. The gate stacks 110 can be formed either by a replacement metal gate process, i.e., replacing a dummy gate (including a sacrificial gate material), or by gate-first process, i.e., directly forming the gate stacks 110 on the substrate 105. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The work function metal(s) can be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and work function layer(s) to form the gate stacks 110. Non-limiting examples of suitable conductive metals include aluminum (Al), platinum (Pt), gold (Au), tungsten (W), titanium (Ti), or any combination thereof.

According to some embodiments, the gate stacks 110 are dummy gates that includes a sacrificial gate material, for example, amorphous silicon (a-Si), polycrystalline silicon (polysilicon), or amorphous carbon.

The gate caps 111 on the gate stacks 110 include an insulating hard mask layer, for example, silicon nitride, SiOCN, or SiBCN. The material forming the gate caps 111 can be deposited using a deposition process, including, but not limited to, PVD, CVD, PECVD, or any combination thereof. The material forming the gate stacks 110 and gate caps 111 are deposited, and then one or more lithography and etching processes are performed to form the stacks shown in FIG. 1.

Figure 2:
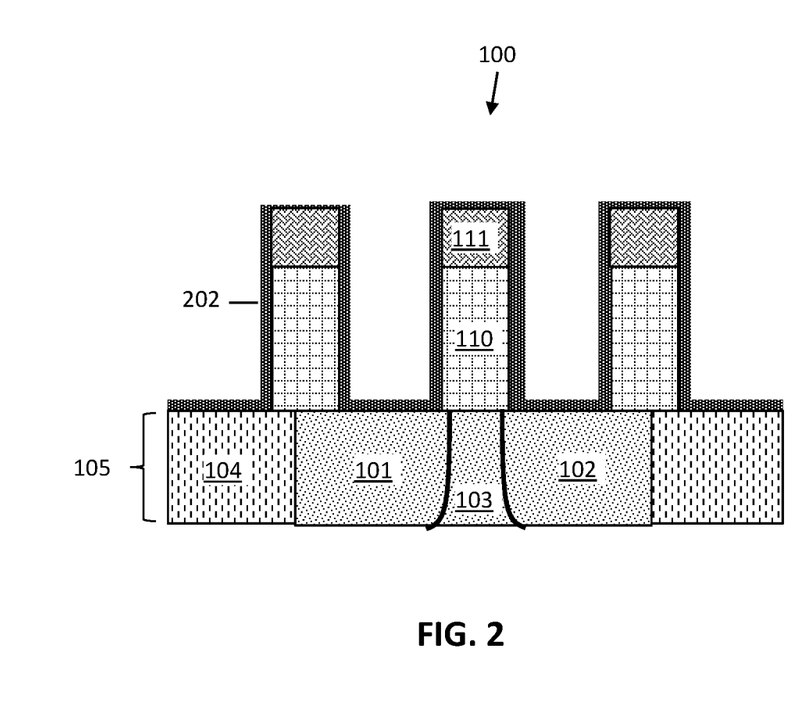
FIG. 2 depicts a cross-sectional side view of the substrate after depositing a first spacer layer on the gate stacks.

FIG. 2 depicts a cross-sectional side view of the semiconductor device 100 after depositing a first spacer layer 202 on the gate stacks 110. The first spacer layer 202 includes a thin nano-layer of a material including silicon (Si) and carbon (C). The compound including Si and C can further include nitrogen (N) according to one or more embodiments of the present invention. In some embodiments of the present invention, the compound of the first spacer layer 202 includes SiCN. In other embodiments of the present invention, the compound of the first spacer layer 202 includes SiC.

The first spacer layer 202 is deposited as a thin nano-layer(s) on sidewalls of the gate stacks 110, each layer having a thickness of about 0.5 to about 2 nanometers (nm) according to some embodiments of the present invention. Overall, each layer of the first spacer layer 202 can have a thickness that varies from 0.3 to 10 nm, depending on the device dimensions. Yet, according to other embodiments, the first spacer layer 202 has a thickness of about 1 to about 2 nm. Any number of first spacer layers 202 can be deposited onto one another to form the first spacer layer 202.

The first spacer layer 202 is deposited by a suitable deposition method, including a chemical vapor deposition (CVD) method, for example, plasma enhanced chemical vapor deposition (PECVD).

When PECVD methods are used, reactant gases are introduced between a pair of parallel electrodes, a grounded electrode and a radio frequency (RF) energized electrode. The capacitive coupling between the electrodes excites reactant gases into a plasma that produces a chemical reaction product that is deposited on the substrate 105. The substrate 105 including the gate stacks 110 is placed on the grounded electrode and heated to temperature of about 200 to about 500° C. according to some embodiments. According to one or more embodiments, the temperature is about 300 to about 400° C.

Various precursor gases for forming the first spacer layer 202 can be used and depend on the type of end material desired. When the material desired includes silicon (Si) (e.g., SiCN or SiC), trimethyl silane can be used as the silicon source gas. When the material desired includes nitrogen (N) (e.g., SiCN), ammonia ($NH_3$) can be used as the nitrogen source gas.

In some embodiments of the present invention, the material forming the first spacer layer 202 is low hydrogen (H) content SiCN, and the source gas mixture includes trimethyl silane, ammonia ($NH_3$), ethylene ($C_2H_4$), and hydrogen ($H_2$). The content of the hydrogen in the low H content SiCN is less than 29 atomic % H in some embodiments, or about 5 to about 29 atomic % H in other embodiments. According to one or more embodiments, the upper limit of H in the low H content SiCN material is about 34 atomic %, and the lower limit of H is about 1 atomic %.

In one or more embodiments of the present invention, the material forming the first spacer layer 202 is carbon (C) rich SiC, and the source gas mixture includes trimethyl silane and ethylene ($C_2H_4$). The ratio of C to Si (C:Si) in the carbon rich SiC material is greater than 1.9 according to some embodiments. According to other embodiments, the upper limit for the ratio of C:Si is about 3, and the lower limit is about 0.5. The high carbon content in the SiC provides a low k for the first spacer layer.

The plasma power and excitation frequencies used for forming the first spacer layer 202 by PECVD are carefully controlled. For a 300 mm diameter PECVD reactor, for example, the RF plasma power used is about 70 to about 250 Watts (W) according to some embodiments of the present invention. According to other embodiments, the RF plasma power range is about 50 to about 600 W. According to one or more embodiments, the RF excitation frequencies used are about 400 kHz to about 13.56 MHz. According to some embodiments, the RF excitation frequencies used are about 250 kHz to about 2.54 GHz.

Figure 3:
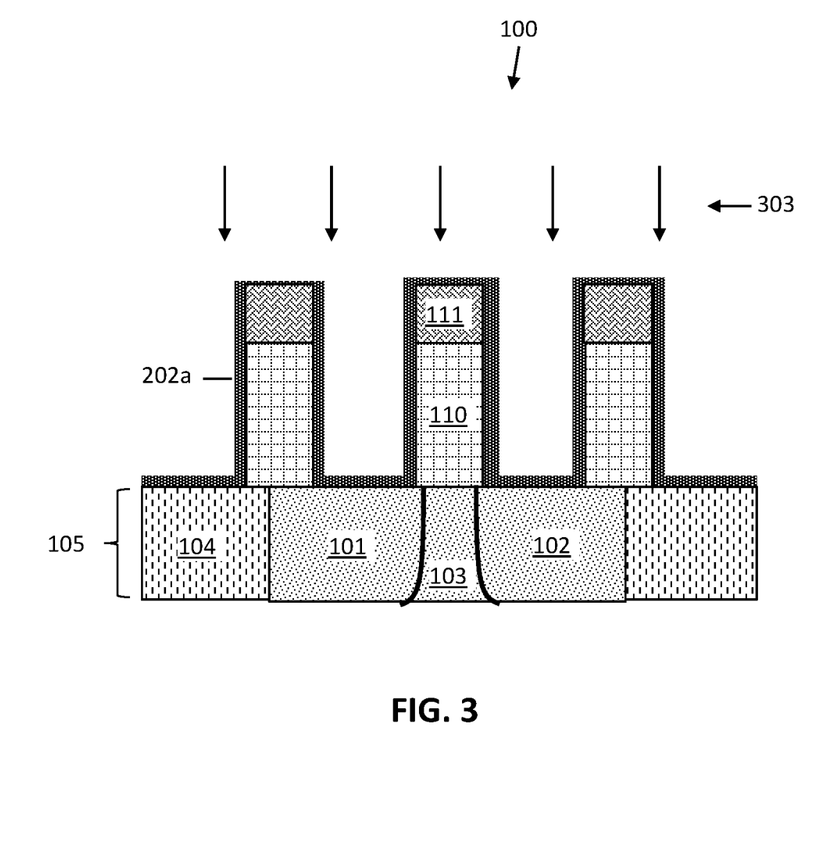
FIG. 3 depicts a cross-sectional side view of the substrate after performing a first plasma treatment.

FIG. 3 depicts a cross-sectional side view of the semiconductor device 100 after performing a first plasma treatment on the first spacer layer 202. The first plasma treatment includes a nitrogen plasma treatment in which nitrogen containing plasma mixture 303 is used to increase the density of the first spacer layer 202, forming first spacer layer 202a. Increasing the density of the first spacer layer 202 provides a more stable spacer material. The nitrogen containing plasma mixture 303 includes nitrogen ($N_2$) only, or a mixture of nitrogen and hydrocarbon gases, e.g., $NH_3$, $H_2$, ethylene, propylene, or a combination thereof. The nitrogen containing plasma mixture 303 also reacts with the surface of the first spacer layer 202, which can remove dangling bonds on the surface and ensure that the reactions within the first spacer layer 202 are complete. With nitrogen only plasma (N$_2$), the nitrogen slightly reacts with and densifies the film's surface, making a portion of the top surface of the layer (about 0.2-0.3 nm) slightly nitrogen rich in composition. For example, the top surface is about 5-10 atomic % higher than the bulk material in some embodiments. With mixtures of other hydrocarbon gas and H$_2$ gases, the surfaces also become slightly nitrogen rich and denser due to the overall net removal of carbon. According to some embodiments, the first plasma treatment of the first spacer layer 202 can be performed by PECVD in the same chamber as used for the first spacer layer 202.

The first spacer layer 202a has a low k value, which is about 3.0 to about 5.3 in some embodiments of the present invention. According to one or more embodiments, the k value is about 3.2 to about 4.2. In other embodiments, the first spacer layer 202 has a k value of less than 5.3.

Figure 4:
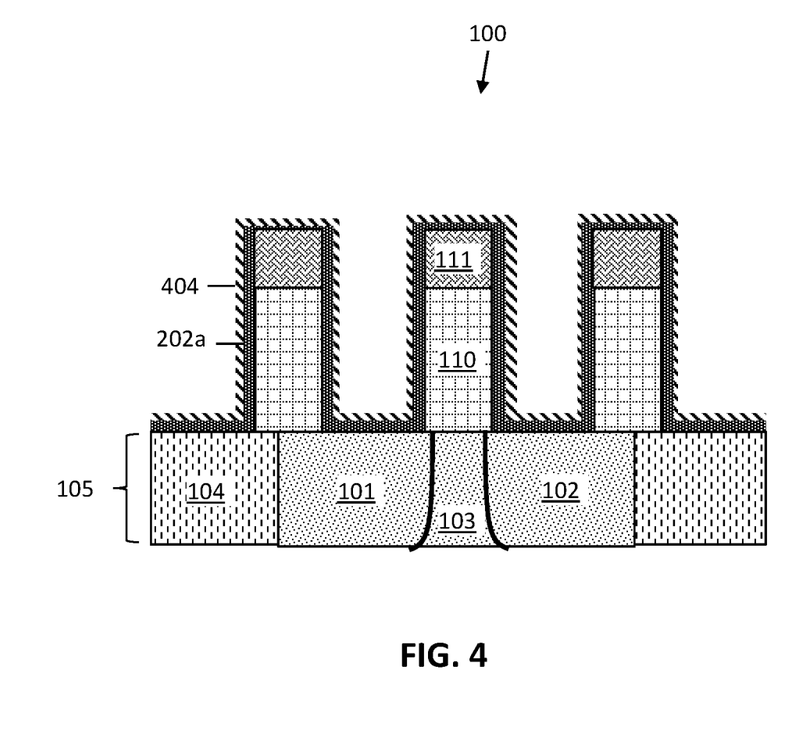
FIG. 4 depicts a cross-sectional side view of the substrate after depositing a second spacer layer on the gate stacks.

FIG. 4 depicts a cross-sectional side view of the semiconductor device 100 after depositing a second spacer layer 404 on the first spacer layer 202a arranged on the gate stacks 110. The second spacer layer 404 includes a thin nano-layer of a material including Si, C, and N. In some embodiments of the present invention, the compound constituting the second spacer layer 404 includes SiCN.

In one or more embodiments of the present invention, the SiCN material is a low H content SiCN material, as described above for first spacer layer 202.

In other embodiments of the present invention, the SiCN material is a C-rich SiCN material, and the source gas mixture includes trimethyl silane, ammonia (NH$_3$), ethylene (C$_2$H$_4$), and hydrogen (H$_2$). The ratio of C to Si (C:Si) in the C-rich SiCN material is greater than 1.9 according to some embodiments. According to some embodiments, the lower limiting for the ratio of C:Si is about 0.65.

In one or more embodiments of the present invention, the SiCN material is a porous C-rich SiCN material, and the source gas mixture includes dimethylsilacyclopentane, ammonia (NH$_3$), and ethylene (C$_2$H$_4$). The porous C-rich SiCN material includes a plurality of pores throughout the material layer, which will provide a lower k value since the dielectric constant of pore (air) is 1. When the second spacer layer 404 includes a porous material, an ultraviolet (UV) curing process is subsequently performed to cure the porous layer. UV curing will remove weakly bonded hydrocarbons and generate pores in the film, lowering the k value while simultaneously making the remaining film denser and with improved breakdown and reduced leakage electrical properties.

The second spacer layer 404 is deposited as a thin nano-layer(s), each layer having a thickness of about 0.5 to about 2 nm according to some embodiments of the present invention. According to some embodiments, each layer has a thickness of about 0.3 to about 10 nm, depending on the device dimensions and application. Yet, according to other embodiments, the second spacer layer 404 has a thickness of about 1 to about 2 nm, or about 2 to about 10 nm according to one or more embodiments. Any number of second spacer layers 404 can be deposited onto one another to form the second spacer layer 404.

The second spacer layer 404 is deposited by a suitable deposition method, including a CVD method, for example, PECVD. According to some embodiments of the present invention, the second spacer layer 404 is formed in the same chamber, and with the same plasma power and excitation frequencies, as used for the first spacer layer 202 and the first plasma treatment.

Figure 5:
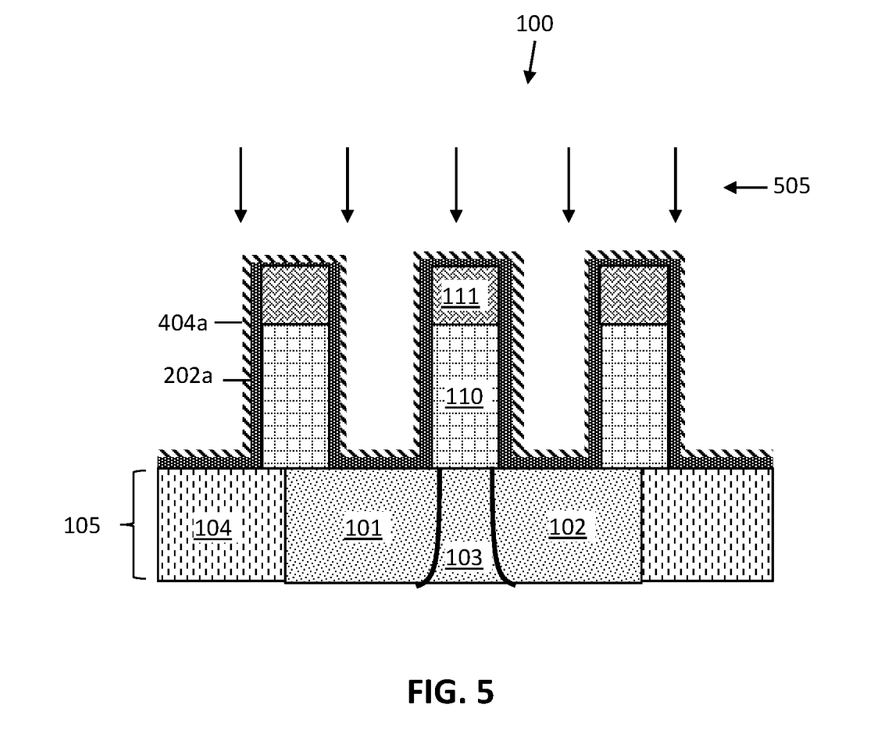
FIG. 5 depicts a cross-sectional side view of the substrate after performing a second plasma treatment.

FIG. 5 depicts a cross-sectional side view of the semiconductor device 100 after performing a second plasma treatment on the second spacer layer 404. The second plasma treatment includes a nitrogen plasma treatment in which nitrogen containing plasma mixture 505 is used to increase the density and stability of the second spacer layer 404, forming second spacer layer 404a. The nitrogen containing plasma mixture 505 includes a mixture of gases as described above for first plasma containing mixture 303. The nitrogen containing plasma mixture 505 also reacts with the surface of the second spacer layer 404, which can remove dangling bonds on the surface and ensure that the reactions within the second spacer layer 404 are complete. According to some embodiments, the second plasma treatment of the second spacer layer 404 can be performed in the same chamber as used for the second spacer layer 404.

The second spacer layer 404a has a low k value, which is about 3.0 to about 5.3 in some embodiments of the present invention. According to one or more embodiments, the k value is about 3.2 to about 4.2. In other embodiments, the second spacer layer 404a has a k value of less than 5.3.

Figure 6:
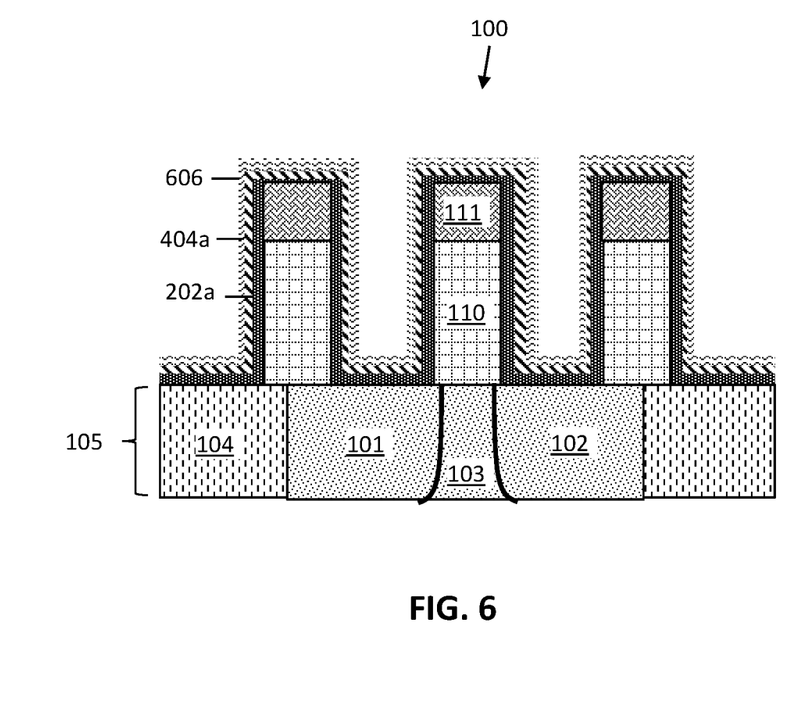
FIG. 6 depicts a cross-sectional side view of the substrate after depositing a third spacer layer on the gate stacks.

FIG. 6 depicts a cross-sectional side view of the semiconductor device 100 after depositing a third spacer layer 606 on the second spacer layer 404a arranged on the gate stacks 110. The third spacer layer 606 includes a thin nano-layer of a material including Si, C, and N, for example, SiCN.

In one or more embodiments of the present invention, the SiCN material is a low H content SiCN material, as described above for first spacer layer 202 and second spacer layer 404. In other embodiments of the present invention, the SiCN material is a C-rich SiCN material, as described above for second spacer layer 404.

The third spacer layer 606 is deposited as a thin nano-layer(s), each layer having a thickness of about 0.3 to about 2 nm according to some embodiments of the present invention. According to some embodiments, the thickness is about 0.3 to about 10 nm, depending on the device dimensions and application. Yet, according to other embodiments, the third spacer layer 606 has a thickness of about 1 to about 2 nm, or about 2 to about 10 nm. Any number of third spacer layers 606 can be deposited onto one another to form the third spacer layer 606.

The third spacer layer 606 is deposited by a suitable deposition method, including a CVD method, for example, PECVD. According to some embodiments of the present invention, the third spacer layer 606 is formed in the same chamber, and with the same plasma power and excitation frequencies, as used for the first and second spacer layers 202, 204.

Figure 7:
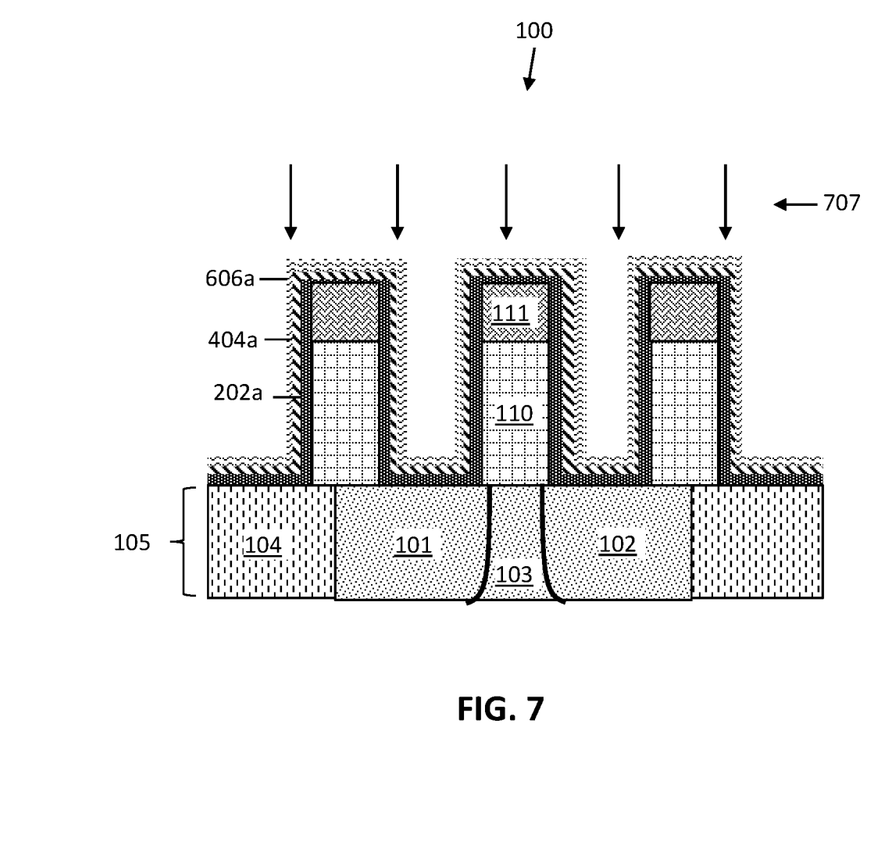
FIG. 7 depicts a cross-sectional side view of the substrate after performing a third plasma treatment.

FIG. 7 depicts a cross-sectional side view of the semiconductor device 100 after performing a third plasma treatment on the third spacer layer 606. The third plasma treatment includes a nitrogen plasma treatment in which a nitrogen containing plasma mixture 707 is used to increase the density and stability of the third spacer layer 606, forming third spacer layer 606a. The nitrogen containing plasma mixture 707 includes a mixture of gases as described above for first plasma containing mixture 303. The nitrogen containing plasma mixture 707 also reacts with the surface of the third spacer layer 707, which can remove dangling bonds on the surface and ensure that the reactions within the third spacer layer 707 are complete. According to some embodiments, the third plasma treatment of the third spacer layer 606 can be performed in the same chamber as used for the third spacer layer 606.

The third spacer layer 606a has a low k value, which is about 3.0 to about 5.3 in some embodiments of the present invention. According to one or more embodiments, the k value is about 3.2 to about 4.2. In other embodiments, the third spacer layer 606a has a k value of less than 5.3.

The above described methods and structures provide for a multilayer spacer with three layers. Although three cycles of spacer formation (first, second, and third spacer layers 202, 404, 606), followed by three nitrogen plasma treatments are described, more than three cycles can be performed, for example, four, five, or six cycles can be performed to form a multilayer spacer with four, five, or six layers. Similarly, less than three cycles can be performed, for example, two cycles can be performed to form a multilayer spacer with two layers. The number of layers depend on the desired final thickness. Each of the processes, including spacer formation and intermediate plasma treatment, can be performed in the same PECVD chamber, as only the precursor gases need to be changed between the processes. Any of the above methods described for forming first, second, and third spacer layers 202, 404, and 606, and subsequent plasma treatment processes, can be repeated to form a final spacer with two, three, or more layers. A total thickness of the final gate spacer 802 is ultrathin, with an overall thickness of less than 10 nm in some embodiments of the present invention.

Although each of the spacer layers will have different k values, the resulting k value of the final spacer material formed will be low, for example, less than 4.0 according to one or more embodiments, or about 3.3 to about 3.7 in some embodiments. According to one or more embodiments, the composite k value of the final spacer material is about 3.4 to about 4.0. Using multiple layers allows incorporation of intermediate layers with slightly higher k values.

Figure 8:
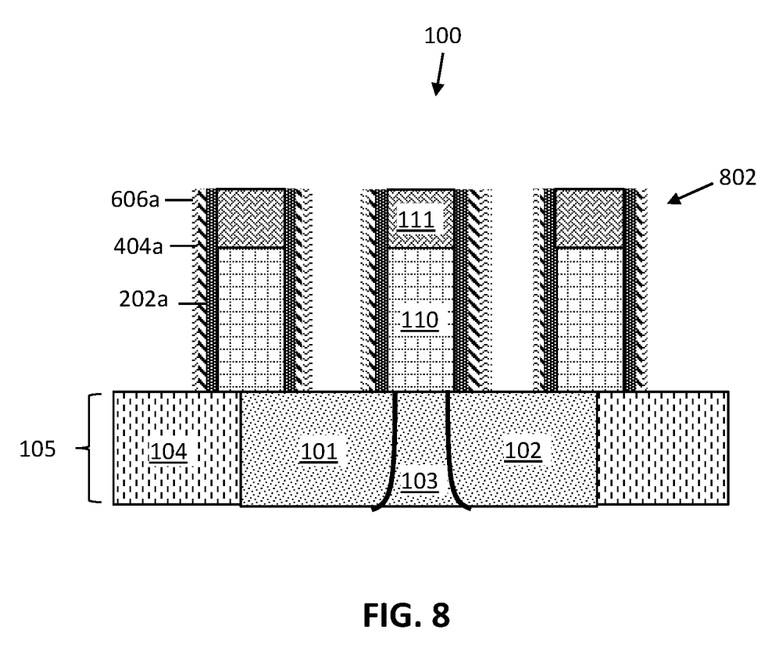
FIG. 8 depicts a cross-sectional side view of the substrate after etching the spacer layers to form gate sidewall spacers.

FIG. 8 depicts a cross-sectional side view of the semiconductor device 100 after etching the spacer layers to form gate sidewall spacers 802. Portions of the first, second, and third spacer layers 202a, 404a, and 606a are removed from the surfaces of the gate caps 111, exposing the gate caps 111 on the gate stacks 110. Portions of the first, second, and third spacer layers 202a, 404a, and 606a are also removed from the surface of the substrate 105.

Figure 9:
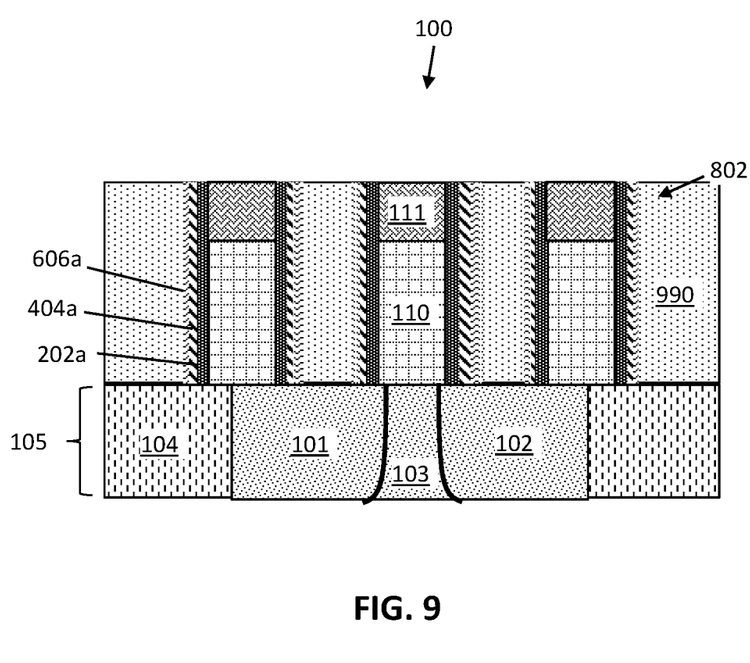
FIG. 9 depicts a cross-sectional side view of the substrate after depositing an inter-level dielectric (ILD) on the gate stacks.

FIG. 9 depicts a cross-sectional side view of the semiconductor device 100 after depositing an inter-level dielectric (ILD 990) on and around the gate stacks 110 and on the substrate 105. The ILD 990 can be formed from, for example, silicon oxide, spin-on-glass, a flowable oxide, a high density plasma oxide, borophosphosilicate glass (BPSG), or any combination thereof.

Figure 10:
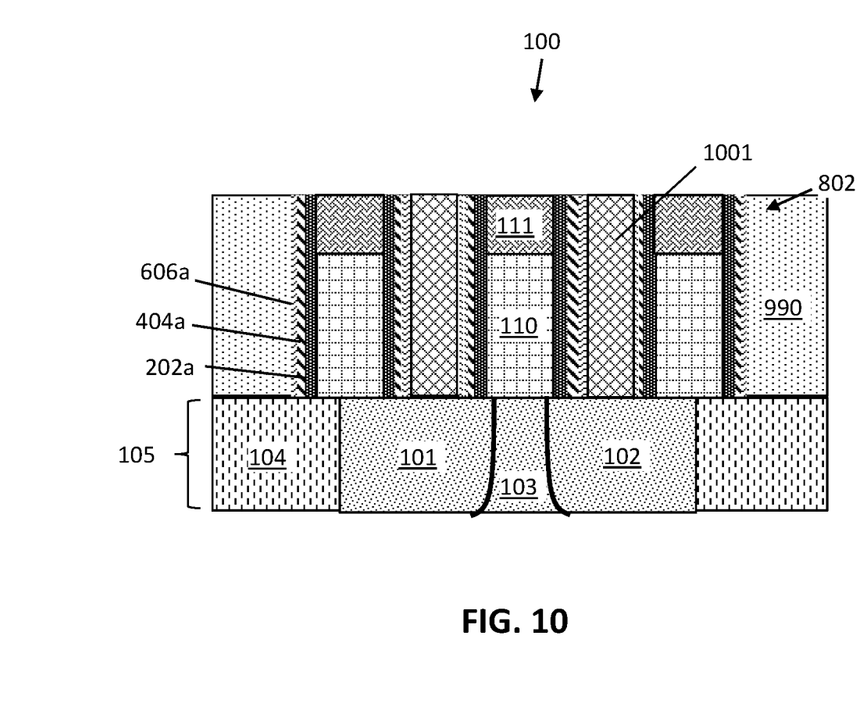
FIG. 10 depicts a cross-sectional side view of the substrate after forming a first portion of source/drain contacts between the gate stacks.

FIG. 10 depicts a cross-sectional side view of the semiconductor device 100 after forming a first portion 1001 of source/drain contacts between the gate stacks 110. One or more masks/resists can be disposed on the gate stacks 110 and ILD 990. Portions of the mask can be simultaneously removed over the source 101 and drain 102 to form a pattern. The mask/resist pattern is transferred into the ILD 990 by removing portions of the ILD 990 between the gates 110 down to the level of the source 101 and drain 102 to form trenches. The trenches are filled with a conductive material or a combination of conductive materials. In one or more embodiments, the trenches are filled with a conductive liner (e.g., titanium followed by tungsten). In other embodiments, the trenches are filled with a metal silicide film and a conductive material up to the level of at least the gate stacks 110, or in some embodiments, the level of the gate caps 111. The conductive can be, but is not limited to, aluminum (Al), platinum (Pt), gold (Au), tungsten (W), titanium (Ti), or any combination thereof.

Figure 11:
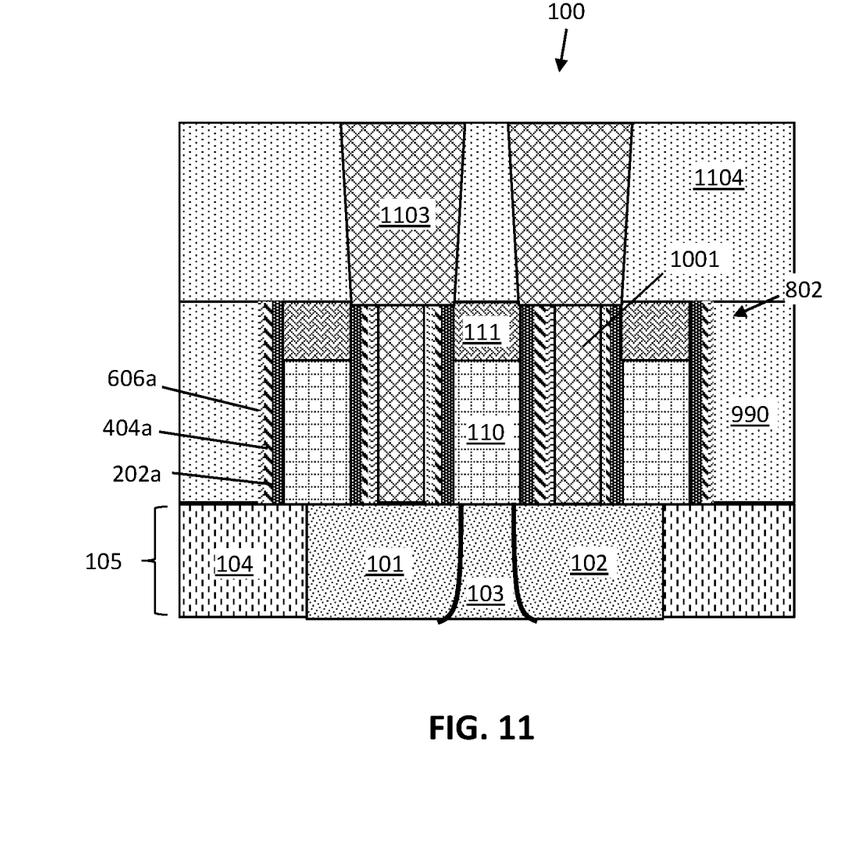
FIG. 11 depicts a cross-sectional side view after of the substrate forming a second portion of source/drain contacts over the gate stacks.

FIG. 11 depicts a cross-sectional side view of the semiconductor device 100 after forming a second portion 1103 of source/drain contacts over the gate stacks 110. Another layer of ILD 1104 is deposited on the gate stacks 110 and first portions 1001 of the source/drain contacts. Trenches are etched through the ILD 1104, and a conductive material is deposited in the trenches, as described above for the first portions 1001.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of making a semiconductor device, the method comprising:
    forming a gate stack on a substrate;
    depositing a first spacer layer on a sidewall of the gate stack, the first spacer layer being SiC;
    performing a first nitrogen plasma treatment process on the first spacer layer to increase a density of the first spacer layer; and
    depositing a second spacer layer on the first spacer layer, the second spacer layer comprising silicon, carbon, and nitrogen.

2. The method of claim 1 further comprising performing a second nitrogen plasma treatment process on the second spacer layer to increase density of the second spacer layer.

3. The method of claim 1, wherein the first spacer layer has a thickness of about 1 to about 2 nanometers (nm).

4. The method of claim 1, wherein the SiC comprises a C to Si ratio greater than 1.9.

5. The method of claim 1, wherein the second spacer layer comprises SiCN.

6. The method of claim 5, wherein the SiCN includes a plurality of pores.

7. A method of making a semiconductor device, the method comprising:
    forming a gate stack on a substrate;
    depositing a first spacer layer on a sidewall of the gate stack, the first spacer layer comprising silicon and carbon and having a hydrogen of about 1 to about 34 atomic %;

depositing a second spacer layer on the first spacer layer, the second spacer layer comprising silicon, carbon, and nitrogen;

depositing a third spacer layer on the second spacer layer, the third spacer layer comprising silicon, carbon, and nitrogen; and performing a nitrogen plasma treatment process on each of the first spacer layer, the second spacer layer, and the third spacer layer;

wherein a combination of the first spacer layer, the second spacer layer, and the third spacer layer has a k value of less than 4.0.

8. The method of claim 7, wherein each of the first spacer layer, the second spacer layer, and the third spacer layer has a thickness of about 1 to about 2 nanometers (nm).

9. The method of claim 7, wherein each of the second spacer layer and third spacer layer comprises SiCN.

10. The method of claim 9, wherein the SiCN includes a plurality of pores.

11. A method of making a semiconductor device, the method comprising:

forming a gate stack on a substrate;

depositing a first spacer layer on a sidewall of the gate stack by a first plasma enhanced chemical vapor deposition (PECVD) method, the first spacer layer being SiC;

performing a first nitrogen plasma treatment on the first spacer layer; and depositing a second spacer layer on the first spacer layer by a second PECVD method, the second spacer layer comprising silicon, carbon, and nitrogen.

12. The method of claim 11 further comprising performing a second nitrogen plasma treatment process on the second spacer layer.

13. The method of claim 11, wherein the first spacer layer has a thickness of about 1 to about 2 nanometers (nm), and the second spacer layer has a thickness of about 2 to about 10 nm.

14. The method of claim 11, wherein the SiC has a C to Si ratio greater than 1.9.

15. The method of claim 11, wherein the second spacer layer comprises SiCN with a plurality of pores.

* * * * *